Sept. 24, 1963 A. E. SLADE 3,105,200

ELECTRICAL SIGNAL TRANSMISSION CIRCUIT

Filed July 2, 1958

Inventor
Albert E. Slade
by Roberts, Cushman & Grover
Attys

United States Patent Office 3,105,200
Patented Sept. 24, 1963

3,105,200

ELECTRICAL SIGNAL TRANSMISSION CIRCUIT

Albert E. Slade, Cochituate, Mass., assignor to Arthur D. Little, Inc., Cambridge, Mass., a corporation of Massachusetts Filed July 2, 1958, Ser. No. 746,247
7 Claims. (Cl. 330—62)

This invention relates to signal transmission circuits such as amplifiers, and particularly to superconductive circuits including superconductive gates responsive to variations in an applied magnetic field to undergo transition between a superconducting or zero resistance state and a state of finite or limited resistance.

As described more fully in The Cryotron, by D. A. Buck, Proc. I.R.E., April 1956, a gate body of superconductive material, e.g. tantalum, when cooled in a bath of liquid helium at 4.2° K., and embraced in a control coil of niobium wire, for example, can be switched between a superconducting or zero resistance state and a state of finite but limited resistance by passing through the control coil a current of sufficient amplitude to subject the gate body to a magnetic field of critical or predetermined value. A superconductive gating device or cryotron has current gain, that is, current in the coil can control a larger current through the gate.

Normally the transition between states is markedly abrupt. The gate quickly changes from zero to finite resistance state in on-off fashion, and its characteristic curve of resistance versus applied magnetic field appears vertical at transition. While a very small incremental increase to critical or predetermined field can thus switch the gate abruptly between states, the characteristic curve at transition has a finite slope and the gate can be held in or varied in a transition phase between zero and finite resistance state. However, a superconductive gate such as the cryotron is so sensitive to field changes that it is difficult to hold the gate in transition phase.

Therefore, it is an object of the present invention to provide a circuit for holding and varying a superconductive gate in transition phase, which circuit is less critically sensitive to small current and field changes.

According to the invention, a signal transmission circuit comprises current supply means, superconductive means connected to said current means and forming two parallel paths each responsive to a predetermined range of magnetic field values to change through a transition resistance range between zero resistance and limited resistance, control means for applying to respective paths a steady magnetic field component with a value in said predetermined range normally holding said paths in the transition resistance range and a variable field component changing the resistance of respective paths in said transistion range, thereby to render one path more resistive than the other path and vary current in said paths, and superconductive output means controlled by variations in current in said paths to transmit a signal dependent on said variable field component.

For the purpose of illustration, a typical embodiment of the invention is shown in the accompanying drawings in which:

FIG. 1 is a characteristic curve of resistance versus field applied to a cryotron gate;

FIGS. 2*a* and 2*b* are output signal curves of a cryotron gate;

Figure 1:
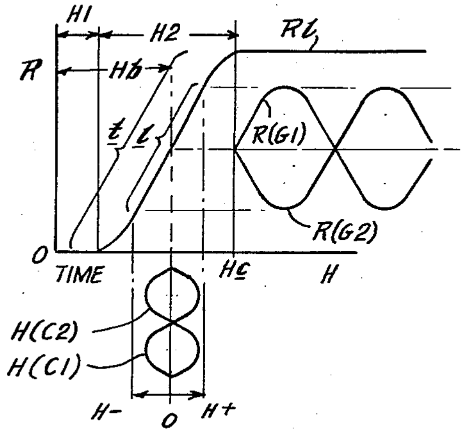

As shown in FIG. 1 the resistance R of a superconducting gate held below critical temperature may be controlled by variation of the applied magnetic field H. The resistance (R) versus field (H) curve comprises a portion *t* of transition between zero resistance and a value of resistance R*l*, which, in the operating temperature range of a cryotron, may be said to be limited despite further increase in field. Within the transition resistance range *t* the curve has a linear range *l*, within which variations in field H will produce proportional variations in resistance of the gate to current through the gate.

Figure 3:
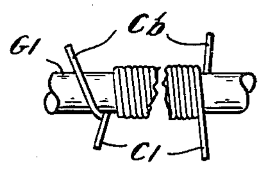
FIG. 3 is a side view of a cryotron gate and control coil.

A cryotron type of gate shown in FIG. 3 comprises a one inch length of 0.009 inch diameter tantalum gate wire embraced by two closely wound niobium coils, C1 and C*b*, each having approximately 100 turns of 0.003 niobium control wire, insulated from each other and the tantalum gate. By way of example, such a gate carrying a maximum current of 800 milliamperes may be controlled through the transition range *t* by current variations in the coil C1 of 100 milliamps.

The gate may be normally held at a point in the linear range *l* by applying a steady field H*b*. The steady or bias field H*b* will equal the field H1 required to raise the gate to the lower threshold of transition plus one-half, or other fraction of, the transition field range H2 depending on the class of amplification desired. Such a steady bias field may be produced by internal current through the gate G1 or by an externally applied field due to current in the bias coil C*b*. If then, a varying signal field H (C1) is superimposed on the steady field such that the total field does not exceed the critical value H*c*, the resistance R (G1) of the gate will vary within the transition range. The resistance variations, curve R (G1), may be made proportional to the input field variation, H (C1), by selection of the bias point.

Figure 4:
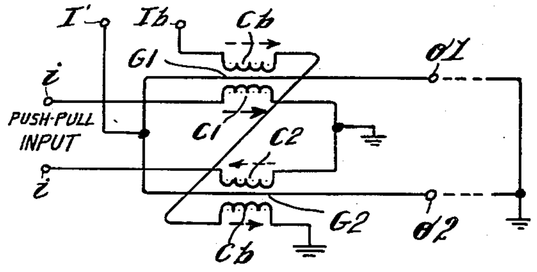
FIG. 4 is a schematic diagram of one stage of superconductive amplifier circuit.

In FIG. 4 is shown a cryotron amplifier circuit comprising a pair of gates G1 and G2 forming parallel and wholly superconductive paths between a primary current terminal I' for connection to a constant-current supply, and output terminals *o* connected to a ground return which collects current through the gates. A steady field is applied to respective gates by bias coils C*b* connected in series between a bias current source I*b* and a ground return. Variable fields are applied to the gates respectively by control coils C1 and C2. Preferably the gate, bias and control circuits are formed by continuous superconductors, e.g. tantalum and niobium wires, but the essential elements are superconductive gates G1 and G2, and bias and control conductors in coil or other form for applying steady and variable fields to the gates.

Figure 2A:
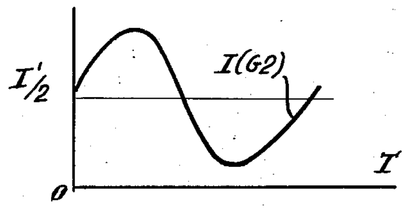
Figure 2B:
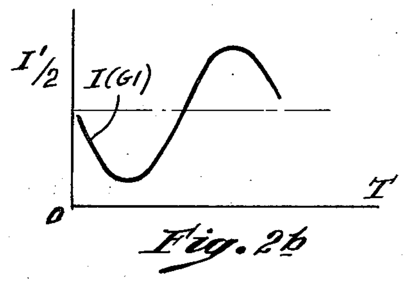
Figure 5:
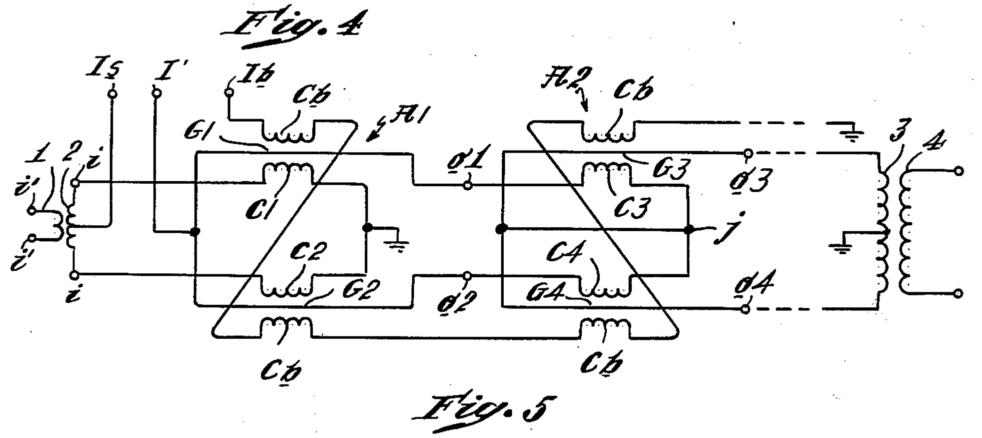
FIG. 5 shows the relation between two amplifier circuits.

A typical input, as later described with reference to FIG. 5, is a push-pull signal in the sense that current changes are opposite in coils C1 and C2. Thus the fields of the bias and control coils, indicated by broken line arrows in FIG. 4, will at any instant reinforce each other at one gate (G1) and oppose each other at the other gate (G2). Thus the field of one control coil subtracts from the bias field and the other adds. If, as shown in FIG. 1, the field H (C1) of coil C1 is in opposite phase to the field H (C2) of coil C2, a "positively" increasing current and field in coil C1 raises the resistance of gate G1, while a "negatively" increasing current and field in coil C2 simultaneously reduces the resistance in gate G2. The resistances R (G1) and R (G2) of gates G1 and G2 thus swing in opposite directions. Since the distribution of primary current from terminal I' is inversely proportional to the resistances of the respective gates, the currents through the gates will swing about a value (I'/2), approximately one-half the primary current, as shown in FIG. 2*a* (gate G2) and FIG. 2*b* (gate G1).

As previously mentioned, a relatively small current in the control coils can control a relatively large current through the gates G2. Hence the output currents I (G1) and I (G2) at output terminals *o* are amplifications of the currents in coils C1 and C2 respectively.

As shown in FIG. 5, further advantage of the novel amplifier circuit may be obtained in coupling two or more successive amplifier stages A1 and A2. Specifically, the primary current-supply terminal I′ may be used not only for the gates of the first stage A1 but also for the gates of the second stage. A constant current is supplied to terminal I′, and although this current is distributed in gates G1 and G2 of stage A1 and control coils C3 and C4 of stage A2, the total current to a common junction *j* of the two paths of stage A2 is the same as that at the terminal I′. After the distributed currents have passed through the control coils C3 and C4 of the second stage A2, the current I′ is supplied to the gates G3 and G4 of this stage by a direct connection to the common junction *j*. This short internal connection within the stage eliminates need for a long supply wire to one or more stages following the first stage A1.

A suitable push-pull input signal may be derived from any A.C. signal by the transformer 1, 2 of FIG. 5. The A.C. signal is applied to terminals *i*′ of the transformer primary 1. The secondary 2 connected to the amplifier A1 input terminals *i* has a center tap connected to a constant current source $I_s$. A change in current in the primary 1 will result in a current increase in one, and a current decrease in the other, of the control coils C1 and C2. The value of the current source $I_s$ may be selected such that the control coils C1 and C2 perform the bias function of coils C*b*.

Similarly the amplified output of the final stage, e.g. terminals *o*3 and *o*4, may be coupled to further circuits, superconductive or otherwise, by the center tapped primary 3 and a secondary 4 of an output transformer. The input and output transformers permit isolation of the circuitry between input terminals *i* and output terminals *o*, which circuitry may be entirely superconductive as previously described.

While I have shown and described an amplifier circuit, it is apparent that the present invention is applicable to other signal transmission circuits, such as rectifiers, clippers and modulators, which may or may not operate with current gain. Thus this description is for the purpose of illustration only and the invention comprises all modifications and equivalents which fall within the scope of the appended claims.

I claim:

1. An electrical signal transmission circuit comprising means forming two magnetically independent, parallel paths having common current input and common current output means, each path including in series a superconductive input gate and an output control conductor, said input gates being responsive to a predetermined range of magnetic field values to change through a transition range between zero resistance and a limited resistance and being normally held in said transition range, control means for applying simultaneously to respective input gates magnetic fields having a variable field component thereby varying the current through said input gates and the magnetic fields produced by the output control conductors of said paths, and superconductive output gate means, said output control conductors applying their magnetic fields directly to said output means.

2. The circuit according to claim 1 wherein the control means for respective input gates are connected to apply said variable field components to said input gates in opposite phase.

3. The circuit according to claim 1 in combination with a like succeeding circuit wherein the output control of the preceding circuit comprises the control means of the succeeding circuit.

4. The circuit according to claim 1 in combination with a like succeeding circuit wherein the parallel paths of respective circuits are connected in series.

5. A circuit according to claim 1 wherein said control means includes a transformer having a superconductive secondary for applying magnetic fields to said input gates.

6. A circuit according to claim 5 wherein said transformer secondary has a center tap for connection to direct current supply means.

7. An electrical signal transmission circuit comprising means forming two magnetically independent, parallel paths having common current input and common current output means, each path including in series a superconductive input gate and an output control conductor, a direct current supply for said parallel paths, said input gates being responsive to a predetermined range of magnetic field values to change through a transition range between zero resistance and a limited resistance, for each input gate control means adapted to be connected to a variable current supply for applying to its gate a magnetic field having a variable field component thereby varying the current through the input gates and output controls of said paths, said input gates normally being held in said transition range by current from one of said current supplies, and superconductive output gate means, said output controls applying their magnetic fields directly to said output gate means.

References Cited in the file of this patent

UNITED STATES PATENTS

| | | |
|---|---|---|
| 2,666,884 | Ericsson et al. | Jan. 19, 1954 |
| 2,725,474 | Ericsson et al. | Nov. 29, 1955 |
| 2,832,897 | Buck | Apr. 29, 1958 |
| 2,935,694 | Schmitt et al. | May 3, 1960 |
| 3,015,041 | Young | Dec. 26, 1961 |

FOREIGN PATENTS

| | | |
|---|---|---|
| 975,848 | France | Oct. 17, 1950 |

OTHER REFERENCES

Slade et al.: National Electronics Conference, vol. 13, Oct. 7–9, 1957, pages 574–582.

Wunderlich (German Patentanmeldung), W12, 727 VIII a/21a2, Nov. 8, 1956.